United States Patent

Shakuda et al.

[11] Patent Number: 5,940,684
[45] Date of Patent: Aug. 17, 1999

[54] METHOD AND EQUIPMENT FOR MANUFACTURING SEMICONDUCTOR DEVICE

[75] Inventors: Yukio Shakuda; Haruo Tanaka, both of Kyoto, Japan

[73] Assignee: Rohm, Co., Ltd., Kyoto, Japan

[21] Appl. No.: 08/859,704

[22] Filed: May 21, 1997

[30] Foreign Application Priority Data

May 23, 1996 [JP] Japan ................................. 8-128186

[51] Int. Cl.⁶ ................................................. H01L 21/205
[52] U.S. Cl. ............................. 438/46; 438/47; 438/503; 117/107; 117/109
[58] Field of Search ................................. 438/22, 45, 46, 438/47, 503, 507, 504, 505, 506, 508, 509, 568, 907, 908, 913, 941; 427/572; 117/56, 107, 109; 257/96; 29/25.01; 118/719, 729; 251/210, 211

[56] References Cited

U.S. PATENT DOCUMENTS

| | | |
|---|---|---|
| 4,636,401 | 1/1987 | Yamazaki et al. ................. 427/572 |
| 4,960,720 | 10/1990 | Shimbo ............................. 117/56 |
| 5,478,780 | 12/1995 | Koerner et al. . |
| 5,670,798 | 9/1997 | Schetzina ......................... 257/96 |

OTHER PUBLICATIONS

G. Lucovsky et al., Formation of Inorganic Films', in Thin Film Processes II, edited by J. Vossen and W. Kern, Academic Press, pp. 585–592 (no month given), 1991.

*Primary Examiner*—Charles Bowers
*Assistant Examiner*—Keith Christianson
*Attorney, Agent, or Firm*—Nikaido Marmelstein Murray & Oram LLP

[57] ABSTRACT

By (a) performing a first treatment process to a substrate in a first apparatus, (b) moving the substrate having undergone the first treatment process into an airtight passage communicating with the first apparatus and shut off from outside and thereafter, shutting off the communication between the passage and the first apparatus, (c) setting the passage to communicate with a second apparatus to move the substrate into the second apparatus, and (d) performing a second treatment process in the second apparatus, the treatment processes are performed in treatment apparatuses suitable therefor without the substrate being exposed to the outside air. As a result, the time between the treatment processes is reduced and the availability ratio of the expensive equipment is improved.

1 Claim, 4 Drawing Sheets

METHOD AND EQUIPMENT FOR MANUFACTURING SEMICONDUCTOR DEVICE

BACKGROUND OF THE INVENTION

The present invention relates to a method and equipment for manufacturing a semiconductor device wherein treatments to be performed under different temperature conditions and in different treatment atmospheres are successively performed such that the epitaxial growth of semiconductor layers of different compositions is successively performed at different temperatures or that a heat treatment is performed during the epitaxial growth of the semiconductor layers.

In manufacturing a semiconductor device, in particular, a semiconductor light emitting device, treatments are continuously performed such that the epitaxial growth of semiconductor layers of different compositions is performed under different temperature conditions or that a heat treatment is performed during the lamination of the semiconductor layers. For example, a blue semiconductor light emitting device using gallium nitride (GaN) based compound semiconductor layers is manufactured in the following manner:

First, a sapphire substrate is placed in a pretreatment chamber to perform a pretreatment at approximately 1100° C. in an atmosphere of hydrogen. Then, after the temperature is decreased to nearly room temperature, the substrate is moved from the pretreatment chamber into a metal-organic chemical vapor deposition (MOCVD) apparatus and a reaction gas is supplied into the apparatus to grow a buffer layer of GaN at approximately 500° C. Then, at a high temperature of 1000° C. or higher, the epitaxial growth of a clad layer and an active layer of GaN based compound semiconductor are successively performed. Then, the substrate is taken out from the MOCVD apparatus and placed in a reactor for heat treatment to perform annealing at approximately 700° C. in an atmosphere of nitrogen.

As described above, when the substrate is moved from the pretreatment chamber into the MOCVD apparatus and from the MOCVD apparatus into the heat treatment chamber, it is necessary to decrease the temperature to nearly room temperature before taking out the substrate and to increase the temperature again after the substrate is placed in another treatment apparatus. For this reason, a waiting time of approximately 30 to 90 minutes is necessary to move the substrate from one apparatus into another at each process. Moreover, even between the treatments performed in the same MOCVD apparatus, it is necessary to increase the temperature within the apparatus from approximately 500° C. to approximately 1000° C. between the growth of the buffer layer to be performed at a low temperature and the epitaxial growth of semiconductor layers forming a light emitting portion to be performed at a high temperature. To change the temperature, approximately 5 to 10 minutes are necessary, so that a long waiting time is necessary between the processes. This increases the number of man-hours and decreases the availability ratio of the expensive equipment.

Additionally, in the epitaxial growth of the semiconductor layers, when the growth in the MOCVD apparatus and the growth in a molecular-beam epitaxy (MBE) apparatus are continuously performed, it is necessary to take the substrate out of one apparatus into the air to move it into the other apparatus, so that not only the temperature is necessarily decreased to nearly room temperature but also the surface of the substrate is oxidized when the substrate is taken out into the air during the epitaxial growth of the semiconductor layers. As a result, high-quality semiconductor layers cannot be grown.

On the other hand, to produce an apparatus which serves as both the MOCVD apparatus and the MBE apparatus, it is necessary to provide the apparatus with all the facilities of the MOCVD and MBE apparatuses and to take measures against corrosion due to an organometallic compound gas. This results in an expensive apparatus. In the case where the treatments are performed only in the MOCVD apparatus, when the number of MOCVD apparatus is increased to perform a mass production, it is necessary to design all of them to be capable of enduring a treatment performed at the highest temperature and of enduring all kinds of gases used for the treatments, so that it is necessary to prepare a plurality of expensive apparatuses.

SUMMARY OF THE INVENTION

The present invention is made to solve these problems and an object thereof is to provide a semiconductor device manufacturing method by which, when treatments to be performed at different temperatures or treatments to be performed in different treatment apparatuses are continuously performed, the number of man-hours necessary for the treatments is reduced and the availability ratio of the expensive equipment is improved.

Another object of the present invention is to provide a semiconductor device manufacturing method by which a high-performance semiconductor device is inexpensively obtained by adopting an optimum treatment apparatus and method for each process and by using a treatment apparatus being inexpensive and designed specifically for a process.

Still another object of the present invention is to provide semiconductor device manufacturing equipment for realizing the above-described method.

A method for manufacturing semiconductor device according to the present invention is characterized in that (a) a first treatment process is performed to a substrate in a first apparatus, (b) the substrate having undergone the first treatment process is moved into a passage communicating with the first apparatus and thereafter, the communication between the passage and the first apparatus is shut off, (c) the passage is made to communicate with a second apparatus to move the substrate into the second apparatus, and (d) a second treatment process is performed in the second apparatus.

The treatment apparatuses mentioned above mean apparatuses used for treatments in the wafer process such as a heat treatment reactor for the heat treatment of the substrate, a growth reactor such as a MOCVD apparatus and a MBE apparatus for the epitaxial growth of a semiconductor layer, and a heat treatment reactor for annealing. Communicating or communication means that the connection between the apparatus and the passage can be performed by shutting off from outside so that the substrate is movable therebetween.

Preferably, the passage has previously been set in an inert atmosphere or evacuated, and after the first treatment process is completed, the passage is made to communicate with the first apparatus. This is because the gas within the first treatment apparatus does not flow into the passage during the first treatment process.

The first and second treatment processes may be each a process of epitaxial growth of a semiconductor layer. The process of epitaxial growth of a semiconductor layer may be performed according to the MBE method and the MOCVD method. Moreover, the first and second treatment processes may be a process of growth of a semiconductor layer and a process of heat treatment, respectively.

A method for manufacturing semiconductor light-emitting device according to the present invention is provided with that (e) moving a wafer-form substrate into a first treatment chamber, (f) moving the substrate into a second treatment chamber by way of a passage shut off from outside to perform a pretreatment comprising a heat treatment, (g) moving the substrate into a third treatment chamber by way of a passage shut off from outside to grow a low-temperature buffer layer of gallium nitride based compound semiconductor at 400 to 650° C., (h) moving the substrate into a fourth treatment chamber by way of a passage shut off from outside to grow semiconductor layers forming a light emitting portion comprising gallium nitride based compound semiconductor at 800 to 1200° C., (i) moving the substrate into a fifth treatment chamber by way of a passage shut off from outside to perform annealing, and (j) moving the substrate into a sixth treatment chamber by way of a passage shut off from outside and decreasing the temperature of the substrate to take out the substrate. As a result a blue semiconductor light emitting device using gallium nitride based compound semiconductor may be effectively manufactured with a fewer number of man-hours.

Note that the gallium-nitride based semiconductor is formed by a III-V compound semiconductor comprising group-III Ga and group-V N wherein part of Ga may be replaced by other group-III elements such as Al and In and/or part of N may be replaced by other group-V elements such as P and As.

Semiconductor manufacturing equipment according to the present invention is provided with a first treatment apparatus for performing a first treatment therein, said first treatment apparatus having in its one side wall an openable and closable window capable of communicating with a passage to move a substrate, a second treatment apparatus for performing a second treatment therein, said second treatment apparatus having in its one side wall an openable and closable window capable of communicating with the passage to move the substrate, and the passage capable of communicating with the first and second treatment apparatuses, respectively.

The first and second treatment apparatuses may be apparatuses for epitaxially growing a semiconductor layer according to different growing methods or may be an epitaxially growth apparatus and a heat treatment apparatus, respectively.

The different growing methods mean methods having different growth mechanisms such as the MOCVD method, the MBE method, a chloride method (a method to form a film by chloridizing the material, for example, into $GaCl_3$ and then causing it to react with ammonia ($NH_3$)), a sputtering method, and an evaporation method.

The passage may be an airtight passage having an openable and closable window and being capable of being moved from the first treatment apparatus to the second treatment apparatus with the substrate conveyed in an enclosed condition.

DETAILED DESCRIPTION

Subsequently, a method and equipment for manufacturing a semiconductor device according to the present invention will be described with reference to the drawings.

Figure 1:
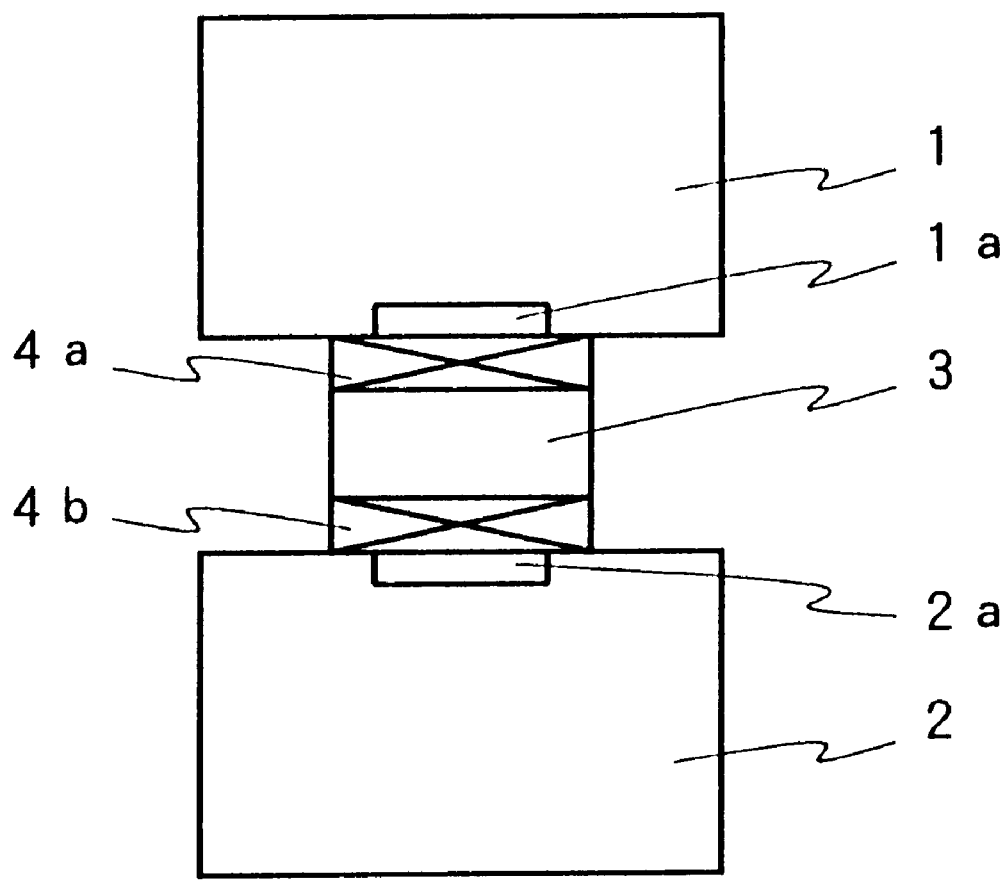
FIG. 1 is a block diagram of an example of manufacturing equipment used for a semiconductor device manufacturing method according to the present invention.

FIG. 1 is a block diagram showing a principal portion of manufacturing equipment according to the present invention. In FIG. 1, reference numeral 1 is a first treatment apparatus, for example, a low-temperature buffer layer growing apparatus (reactor) for growing a semiconductor layer at 400 to 650° C. Reference numeral 2 is a second treatment apparatus, for example, a high-temperature semiconductor growing apparatus (reactor) for epitaxially growing a semiconductor layer at 700 to 1200° C. Reference numeral 3 is an airtight passage having a vacuum suction pump and/or a gas admitting opening. The passage 3 is evacuated or filled with an inert gas as to the wafer being treated. The ends of the passage 3 are connected to the first and second treatment apparatuses 1 and 2 through valves 4a and 4b, respectively. At the portions of the first and second treatment apparatuses 1 and 2 at which they are connected to the passage 31 openable and closable windows 1a and 2b are provided, respectively. When the wafer to be treated is moved between the first or the second treatment apparatus 1 or 2 and the passage 3, the window 1a or 2a is opened so that the apparatus 1 or 2 and the passage 3 communicate with each other. After the wafer has been moved, the window 1a or 2a is closed.

Subsequently, a method will be described for manufacturing a blue semiconductor laser comprising semiconductor layers of GaN based compound semiconductor deposited with this equipment.

First, a wafer comprising a sapphire substrate is heat-treated at approximately 1100° C. in a non-illustrated pretreatment chamber and conveyed into the first treatment chamber 1. The first treatment chamber 1 is a low-temperature growth MOCVD apparatus for growing a low-temperature buffer layer. After the substrate has been moved into the first treatment chamber 1, trimethylgallium (TMG) and ammonia ($NH_3$), for example, are admitted at flow rates of 1 to 100 cc/min and 1 to 30 liters/min, respectively, and the temperature is increased so that the substrate temperature is 400 to 600° C. The growth pressure within the MOCVD apparatus at this time is set, for example, at 10 to 600 torr. By performing vapor deposition for approximately 5 to 30 minutes after the temperature and the gas within the first treatment chamber 1 are stabilized, GaN is grown by approximately 0.01 to 0.3 $\mu$m to form a low-temperature buffer layer.

Then, the admission of the reaction gas is stopped to perform vacuum suction for several tens of seconds and the window 1a and the valve 4a are opened so that the first treatment apparatus 1 communicates with the passage 3 which has previously been evacuated to approximately 1 torr so that it is as vacuum as the first treatment apparatus 1. Then, the wafer in the first treatment apparatus 1 is moved into the passage 3 and the window 1a and the valve 4a are closed. Then, the window 2a and the valve 4b of the second treatment apparatus 2 are opened and the wafer in the passage 3 is moved into the second treatment apparatus 2. The second treatment apparatus 2 is a high-temperature growth MOCVD apparatus for growing a GaN based compound semiconductor layer at a high temperature, and has previously been evacuated to approximately 1 torr and set at 700 to 1200° C. After the wafer has been moved into the second treatment apparatus 2, the window 2a and the valve 4b are closed, and gasses for vapor deposition, for example, the above-mentioned TMG and $NH_3$ are admitted at flow rates of 1 to 100 cc/minute and 1 to 30 liters/minute, respectively, to perform vapor deposition for approximately 60 minutes including the time for uniformizing the gases within the apparatus 2. As a result, a GaN layer of approximately 1 to 4 $\mu$m is grown. The movements of the substrate from the first treatment apparatus 1 to the passage 3 and from the passage 3 to the second treatment apparatus 2 are made, for example, by an operation rod provided in each treatment apparatus.

By preparing the first and second treatment apparatuses 1 and 2 and previously increasing the temperature within the second treatment apparatus 2 to a temperature for high-temperature growth like in the present invention, the time between the end of the first treatment process, i.e. the growth of the low-temperature buffer layer and the start of the second treatment process, i.e. the vapor deposition in the MOCVD apparatus for high-temperature growth is reduced to approximately 1 to 3 minutes which is much shorter than the conventional waiting time of 5 to 10 minutes necessary for increasing the temperature from a low temperature to a high temperature. While the first and second treatment apparatuses 1 and 2 and the passage 3 are evacuated when the wafer is moved therebetween, the wafer may be moved with the passage 3 being filled with the inert gas as long as the atmospheric gas of the previous process does not do harm to the succeeding process.

In the example of FIG. 1, the buffer layer of GaN grown at a low temperature and a semiconductor layer forming a light emitting portion comprising GaN based compound semiconductor grown at a high temperature are grown in different apparatuses. Thus, even in the case where only the reaction temperatures are different, it is only necessary to move the substrate from the first treatment apparatus 1 to the second treatment apparatus 2, so that the time necessary for changing the temperature within the apparatus is reduced. However, a treatment apparatus may be prepared which is designed specifically for each of the treatment processes including processes other than the growth of the semiconductor layer so that the wafer to be treated is moved successively from one apparatus to another.

Figure 2:
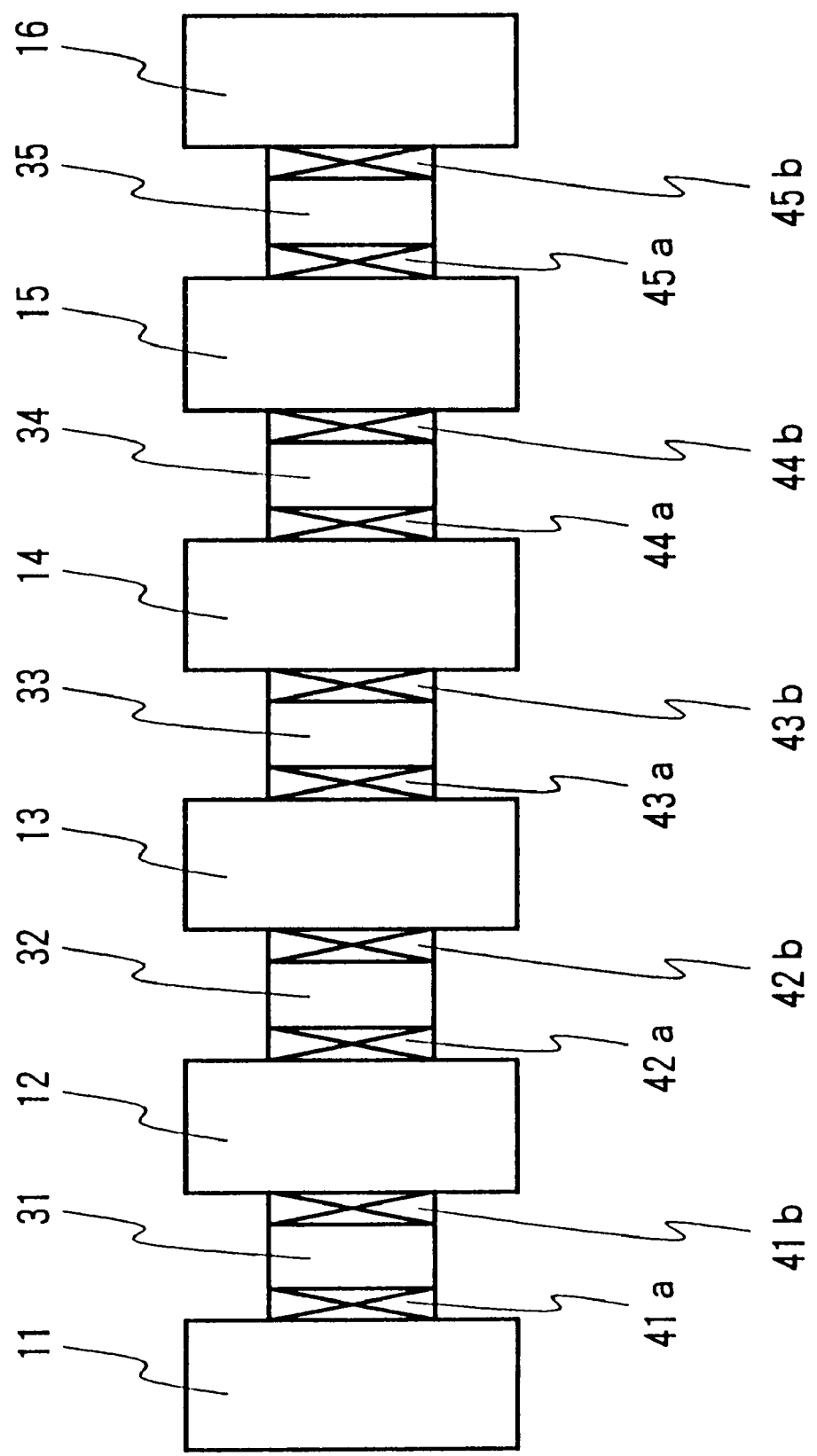
FIG. 2 is a block diagram of another example of manufacturing equipment used for the semiconductor device manufacturing method according to the present invention.

FIG. 2 is a block diagram of assistance in explaining manufacturing equipment employing another semiconductor device manufacturing method according to the present invention. In the example shown in FIG. 2, in addition to a treatment chamber designed specifically for the epitaxial growth of the semiconductor layer, treatment chambers are provided which are designed specifically for the pretreatment and for the heat treatment for annealing performed after the epitaxial growth. The treatment chambers are connected by passages so that the chambers and the passages may communicate with each other. The treatment processes are performed in different treatment chambers.

In FIG. 2, reference numerals 11 to 16 are first to sixth treatment chambers between which first to fifth passages 31 to 35 filled with an inert gas or evacuated are connected through valves 41a and 41b to 45a and 45b like in the example shown in FIG. 1 so that the wafer may be moved between the treatment chambers and the passages by opening and closing the non-illustrated openable and closable windows and the valves of the treatment chambers 11 to 16.

The first treatment chamber 11 is, for example, a chamber set at room temperature and in an atmosphere of nitrogen for conveying the wafer thereinto. The second treatment chamber 12 is, for example, a pretreatment chamber set at approximately 1100° C. and evacuated or set in an atmosphere of hydrogen for performing the pretreatment of the wafer comprising a sapphire substrate. The third treatment chamber 13 is a low-temperature growth MOCVD apparatus set at approximately 400 to 650° C. for growing the low-temperature buffer layer of GaN. The fourth treatment apparatus is, for example, a high-temperature growth MOCVD apparatus for depositing semiconductor layers forming a light emitting portion comprising n-type layer and p-type layer composed of GaN based compound semiconductor. The fifth treatment chamber 15 is, for example, a reaction chamber for heat treatment to activate a p-type layer after the semiconductor layers of GaN based compound semiconductor are grown. The sixth treatment chamber 16 is a chamber set at room temperature and in an atmosphere of nitrogen for taking out the wafer therefrom.

Figure 4:
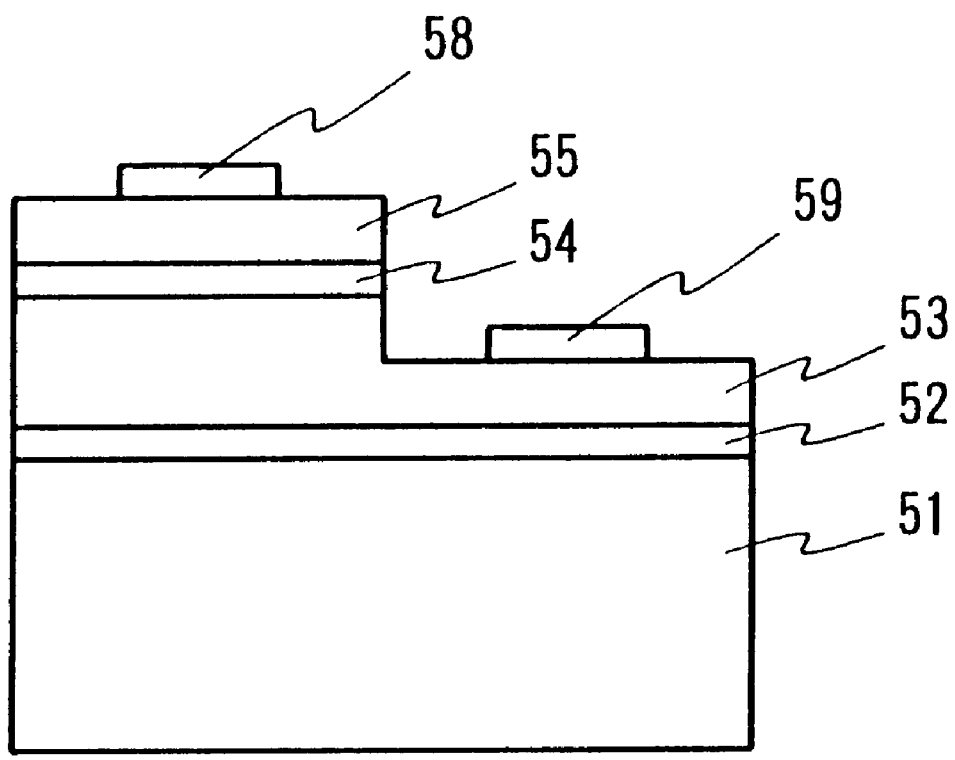
FIG. 4 is a diagram showing structures for a semiconductor light emitting device chip according to the present invention.

To manufacture a blue semiconductor light-emitting device comprising a lamination of GaN based compound semiconductor layers with the manufacturing equipment, as shown in FIG. 4, first, a wafer comprising a sapphire substrate 51 is conveyed into the first treatment chamber 11 with the epitaxial growth surface upward. Then, as described with reference to FIG. 1, the non-illustrated window and the valve 41a are opened so that the first treatment chamber 11 communicates with the first passage 31 and the wafer is moved into the first passage 31. Then, the communication with the first treatment chamber 11 is shut off and the second treatment chamber 12 and the second passage 32 are made to communicate with each other to move the wafer into the second treatment chamber 12. In doing so, the second treatment chamber 12 may have previously been evacuated or the hydrogen gas for the pretreatment may have previously been flowed therein. When the hydrogen gas has previously been flowed, the hydrogen gas is mixed with the nitrogen gas in the passage 31. However, by flowing the hydrogen gas within the second treatment chamber 12, the hydrogen gas completely substitutes for the nitrogen gas in several seconds. Since the temperature in the second treatment chamber 12 has previously been increased to approximately 1100° C., the pretreatment is immediately started together with the substitution of the internal gas and is completed in approximately 5 to 30 minutes.

Then, by similar procedures, the wafer is moved into the second passage 32 and the communication with the second treatment chamber 12 is shut off. In doing so, preferably, the second passage 32 has previously been evacuated and after the second treatment chamber 12 is evacuated, the wafer is conveyed into the second passage 32. This is because the gases are not mixed. However, in the case where the gas in the previous treatment apparatus does not do any harm when mixed with the gas in the succeeding apparatus, since the gas substitution is completely made by the flowing of the gas for several seconds as mentioned above, it is not always necessary to completely evacuate the second treatment chamber 12 before the wafer is moved into the second passage 32 but the communication with the passage 32 may be made with the passage 32 being filled with an inert gas such as nitrogen gas. Then, the second passage 32 is made to communicate with the third treatment chamber 13 to move the wafer into the third treatment chamber 13 and the communication with the passage 32 is shut off. The third treatment chamber 13 has previously been set at 400 to 650° C. and TMG, $NH_3$ and $H_2$ are flowed therein at the above-mentioned flow rates, so that GaN immediately starts to deposit and low-temperature buffer layer 52 is grown to a thickness of approximately 0.01 to 0.3 $\mu$m in approximately 5 to 30 minutes.

Then, the wafer is moved by way of the third passage 33 into the fourth treatment chamber 14 by similar procedures and the communication with the third passage 33 is shut off. Since the temperature of the fourth treatment chamber 14 has been increased to 800 to 1200° C. and the above-mentioned mixture of the gases has been flowed therein so that the growth pressure is 10 to 760 torr, the atmospheric temperature and gas surrounding the wafer are immediately changed to those for epitaxial growth, so that semiconductor layers forming a light emitting portion comprising an n-type cladding layer 53, an active layer 54, and a p-type cladding layer 55 made of GaN based compound semiconductor are epitaxially grown by changing the reaction gas or doping gas respectively. When a semiconductor layer including an AlGaN based compound semiconductor or further including In is epitaxially grown, a reaction gas such as trimethylaluminum (TMA) gas or trimethylindium (TMIn) gas is added or used as an alternative.

After the necessary semiconductor layers are deposited, the wafer is moved into the fifth treatment chamber 15 by similar procedures to perform the after-growth heat treatment. The fifth treatment apparatus 15 has previously been set in an atmosphere of nitrogen, at 10 to 760 torr and at 300 to 900° C. The heat treatment is immediately started and completed in approximately 5 to 60 minutes.

Then, the wafer is moved into the sixth treatment apparatus 16 by similar procedures. Since the sixth treatment apparatus 16 has been set in an atmosphere of nitrogen and at room temperature, the temperature of the wafer is decreased to nearly room temperature in approximately 10 to 30 minutes, so that the wafer is easily taken out.

Thereafter, a portion of the p-type cladding layer 55 and the active layer 54 is etched away to expose the n-type cladding layer 53, and p-side electrode 58 and n-side electrode 59 are provided by metal evaporation or the like, so as to be electrically connected with p-type cladding layer 55 and n-type cladding layer 53 respectively.

In the series of treatment processes, the treatments are successively performed without any waiting time therebetween such that when a wafer is conveyed into the next treatment chamber for the next treatment, another wafer is conveyed into the previous treatment chamber to be treated therein. Consequently, the treatments are effectively performed at a high availability ratio since time-wasting operations such as changing the temperatures in the treatment apparatuses are unnecessary.

While GaN is grown as the epitaxially grown semiconductor layers in the above-described examples, another kind of semiconductor layer such as a mixed crystal semiconductor layer mixed with another element or a GaAs semiconductor layer may be deposited by changing the gas admitted during the growth or by adding a gas. Moreover, according to the present invention, since the treatment apparatuses are each designed specifically for a treatment, even in the case where the semiconductor layers are continuously epitaxially grown, different methods such as MOCVD and MBE may easily be used in combination.

For example, using a MBE apparatus as the low-temperature growth apparatus for growing the buffer layer, nitrogen is admitted at a flow rate of 0.1 to 10 cc/minute and excited at a high frequency of 10 MHz to 2.6 GHz. Then, the cell temperature of metallic gallium is set at 500 to 1100° C. and the temperature of the substrate (wafer) is set at 200 to 800° C., so that a low-temperature buffer layer of GaN is grown by approximately 0.01 to 0.3 μm. Thus, with the MBE apparatus, $N_2$ gas which is less expensive than $NH_3$ gas used for the MOCVD apparatus may be used, so that the cost is reduced. Thus, according to the present invention, since the treatment chambers are each designed specifically for a treatment, the most suitable method can be selected for the semiconductor layer to be grown.

Figure 3:
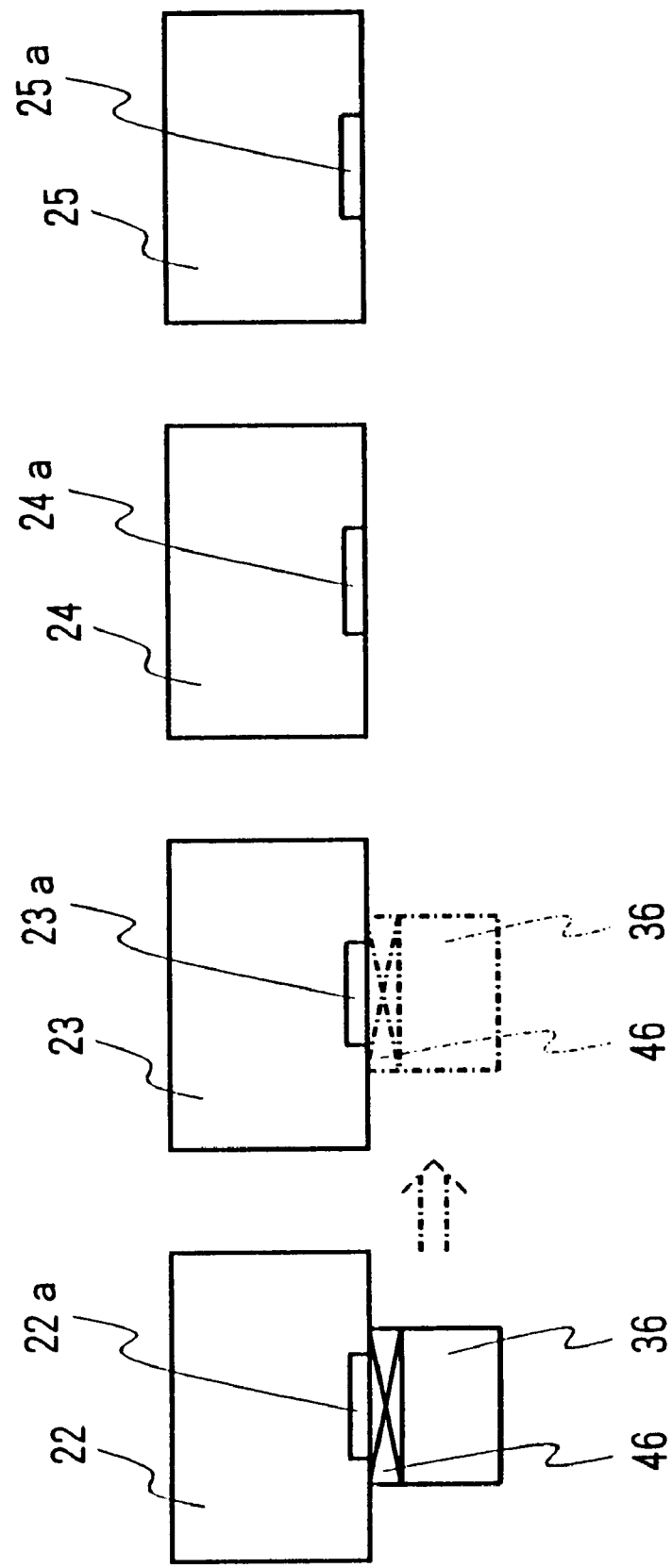
FIG. 3 is a block diagram of still another example of manufacturing equipment used for the semiconductor device manufacturing method according to the present invention.

FIG. 3 is a block diagram showing another example of equipment used for manufacturing a semiconductor device according to the present invention. In this example, the treatment chambers are not connected to the passage but a mobile airtight passage is used. Specifically, in FIG. 3, reference numerals 22, 23, 24 and 25 are second, third, fourth and fifth treatment apparatuses which have openable and closable windows 22a, 23a, 24a and 25a, respectively. The treatment apparatuses 22 to 25 are connected and disconnected to and from a valve 46 of a mobile airtight passage 36 at the windows 22a to 25a.

The mobile airtight passage 36 has a vacuum suction machine and a gas admitting opening like the previously-described passage and is filled with a gas inert toward the wafer to b e treated, or evacuated. The wafer is moved between the treatment chambers 22 to 25 by opening and closing the valve 46 and the windows 22a to 25a of the treatment chambers 22 to 25. This example is characterized in that the movements of the wafer between the treatment chambers are all made through one mobile airtight passage 36. Specifically, the wafer moved from the second treatment chamber 22 into the mobile airtight passage 36 connected to the second treatment chamber 22 is conveyed into the third treatment chamber 23 by moving the mobile airtight passage 36 with the valve 46 closed to connect it to the third treatment chamber 23 and opening the valve 46 and the window 23a. Then, the valve 46 and the window 23a are closed and the treatment in the third treatment chamber 23 is performed. After the treatment in the third treatment chamber 23 is completed, the wafer is moved into the mobile airtight passage 36 in a like manner. The mobile airtight passage 36 containing the wafer is moved to the fourth treatment apparatus 24 with the valve 46 closed again and is connected to the portion of the window 24a. Then, the wafer is moved into the fourth treatment apparatus 24 in a like manner. The treatment in each treatment apparatus is performed in a like manner.

According to the example shown in FIG. 3, it is unnecessary to arrange various kinds of treatment apparatuses in series, so that the layout of the treatment apparatuses is easily made.

According to the present invention, the waiting time to increase or decrease the temperature between the treatment processes is greatly reduced, so that the number of man-hours is remarkably reduced. Further, the treatment apparatuses hardly have any waiting time and in the case of mass production, the treatments may be performed in parallel, so that the productivity per apparatus greatly improves to increase the availability ratio of the equipment. In addition, since an optimum method for each treatment may be employed such as the growth of the semiconductor layer according to the MOCVD method or the MBE method, high-quality semiconductor devices are inexpensively manufactured.

Moreover, according to the manufacturing equipment of the present invention, since the treatment apparatuses are each designed to be suitable for a specific treatment, it is unnecessary to design them to be capable of enduring temperatures and gasses used for various treatments, so that the treatment apparatuses are inexpensively manufactured. As a result, the cost of the equipment is greatly reduced.

Although preferred embodiments have been described in some detail, it is to be understood that certain changes can be made by those skilled in the art without departing from the spirit and scope of the invention as defined by the appended claims.

What is claimed is:

1. A method for manufacturing a semiconductor light-emitting device comprising the steps of:

conveying a wafer-form substrate into a first treatment chamber which is set in an atmosphere of vacuum, inert gas or reducing gas;

transferring said substrate into a passage which is subsequently shut off from outside;

transferring said substrate from said passage into a second treatment chamber;

performing a pretreatment comprising a heat treatment;

transferring said substrate into a passage which is subsequently shut off from outside;

transferring said substrate into a third treatment chamber;

growing a low-temperature buffer layer of gallium nitride based compound semiconductor at 400 to 650° C.;

transferring said substrate into a passage which is subsequently shut off from outside;

transferring said substrate into a fourth treatment chamber;

growing semiconductor layers having a first electric conductive cladding layer, an active layer, and a second electric conductive cladding layer, comprising gallium nitride based compound semiconductor at 800 to 1200° C.;

transferring said substrate into a passage which is subsequently shut off from outside;

transferring said substrate into a fifth treatment chamber;

preforming annealing;

transferring said substrate into a passage which is subsequently shut off from outside;

transferring said substrate into a sixth treatment chamber;

decreasing temperature of said substrate to take out said substrate; and providing electrodes by etching a part of said semiconductor layers, and electrically connecting with said first electric conductive cladding layer exposed by said etching and said second electric conductive type cladding layer on the surface side, respectively.

* * * * *